US006894262B2

(12) United States Patent
Gao et al.

(10) Patent No.: US 6,894,262 B2
(45) Date of Patent: May 17, 2005

(54) CLUSTER-WEIGHTED MODELING FOR MEDIA CLASSIFICATION

(75) Inventors: Jun Gao, Mountain View, CA (US); Ross R. Allen, Belmont, CA (US)

(73) Assignee: Hewlett-Packard Development Company L.P., Houston, TX (US)

( * ) Notice: Subject to any disclaimer, the term of this patent is extended or adjusted under 35 U.S.C. 154(b) by 52 days.

(21) Appl. No.: 10/050,346

(22) Filed: Jan. 15, 2002

(65) Prior Publication Data

US 2003/0132366 A1 Jul. 17, 2003

(51) Int. Cl.[7] .............................................. H01L 27/00
(52) U.S. Cl. ............................... 250/208.1; 250/559.4; 382/225; 356/71
(58) Field of Search ........................... 250/208.1, 559.4, 250/559.41, 556; 356/71, 237.1, 237; 382/224–225, 190, 195; 358/488, 498; 209/576, 577, 938, 939; 702/179, 181

(56) References Cited

U.S. PATENT DOCUMENTS 5,488,223 A 1/1996 Austin et al. ............... 235/375
5,591,985 A * 1/1997 Tsuji et al. ............ 250/559.41
5,724,259 A 3/1998 Seymour et al. ............ 364/526
5,929,432 A 7/1999 Yamakawa ............... 250/208.1
6,291,829 B1 * 9/2001 Allen et al. ............ 250/559.07
6,496,251 B1 * 12/2002 Wunderer .................... 356/71
6,517,180 B2 * 2/2003 Tullis et al. .................. 347/19

FOREIGN PATENT DOCUMENTS

EP 1034937 9/2000

OTHER PUBLICATIONS

Schoner, Bernd, et al., "Cluster–Weighted Modeling: Probabilistic Time Series Prediction, Characterization and Synthesis," Ch. 15, Non–Linear Dynamics and Statistics, pp. 365–385, no date.

* cited by examiner

*Primary Examiner*—Christopher W. Fulton
*Assistant Examiner*—Yaritza Guadalupe

(57) ABSTRACT

A probabilistic input-output system is used to classify media in printer applications. The probabilistic input-output system uses at least two input parameters to generate an output that has a joint dependency on the input parameters. The input parameters are associated with image-related measurements acquired from imaging textural features that are characteristic of the different classes (types and/or groups) of possible media. The output is a best match in a correlation between stored reference information and information that is specific to an unknown medium of interest. Cluster-weighted modeling techniques are used for generating highly accurate classification results. Within the imaging process, grazing angle illumination (i.e., introducing light at an angle of at least 45 degrees to the normal of the surface being imaged) provides sufficient contrasts for distinguishing the structural features (e.g., paper fibers) of the unknown medium, but non-grazing illumination may be used when specular measurements are to be obtained.

12 Claims, 6 Drawing Sheets

CLUSTER-WEIGHTED MODELING FOR MEDIA CLASSIFICATION

TECHNICAL FIELD

The invention relates generally to methods and systems for classifying media and more particularly to classifying a type of medium on which print material is to be applied, such that the invention may be used in applications that include ink jet printing and liquid or dry electrophotographic printing.

BACKGROUND ART

There are advantages to classifying a print medium as being recycled paper, glossy paper, or some other media type prior to applying ink to the medium. The classification allows a printer to be set in a print mode which matches the paper, so that a loss of print quality is not incurred. The print mode sets the print parameters, which may influence both the raster image processing techniques and the writing system parameters, such as the number of drops of ink per pixel location, the number of passes by an ink cartridge during the printing process, and the selection of color maps. The classification of the print medium may also reduce the occurrences of damage to a print engine. For example, the coatings on some ink jet transparency films can melt on a fuser roller of commercially available electrophotographic printers, causing damage that requires the fuser roller to be replaced.

Many print drivers allow a user to manually identify the print medium. Thus, a print driver dialog box may be presented to the user to enable selection. However, this ability is often disregarded by users. Instead of selecting a medium from a list of possible media, users may settle for the default setting of the plain paper-normal mode. As a result, even if a user inserts an expensive photo media into a printer, the resulting image is sub-standard when the normal mode is selected.

One possible system for a printer to adopt an optimal print mode for a specific type of incoming media without requiring user intervention utilizes a bar code on a portion of the print medium or on a retainer (e.g., a paper tray) that supports the print medium. U.S. Pat. No. 5,488,223 to Austin et al. describes a system and method of automatically selecting print parameters upon detecting a bar code. A printer includes a bar code scanner which is used to discriminate media types and to set print parameters, such as print speed, printhead pressure, and burn duration.

Another approach for automatically classifying print media types utilizes one or both of sensing transmissivity and sensing reflectivity. For example, a media type detector may be used to sense diffuse and specular reflection, with a pixel size of approximately 40 $\mu$m, as measured on the paper. Different media types will have different ratios of the two reflectivity values. To implement the approach, a database having a look-up table of the reflectivity ratios is used to correlate the ratios with the different types of print media.

While the prior art approaches operate reasonably well for their intended purposes, what is needed is an automated method and system for inexpensively distinguishing media types, with a high level of accuracy and a low level of complexity.

SUMMARY OF THE INVENTION

Media classification is achieved by generating a probabilistic input-output system having at least two input parameters and having an output that has a joint dependency on the input parameters. The probabilistic input-output system is a multi-dimensional arrangement in which the input parameters are associated with image-related measurements acquired from imaging textural features which are characteristics of the different classes of media. The output is a best match in a correlation between stored reference input information and input information that is acquired by imaging an unknown medium of interest.

In one embodiment, the probabilistic input-output system relates texture-dependent vectors (x) to media-classification identification outputs (y). The image-related measurements may be acquired by computing the means and the standard deviations for each of a number of different illumination sources at the angle of incidence of the relevant illumination. However, other measurements may be substituted. In a preliminary training procedure, the mean and the standard deviation of the measured means and standard deviations may be calculated for multiple samples of each media class and stored as references in a look-up table. The media classes may be "groups" in which media types are grouped on the basis of similar recording characteristics and desired print parameters, such as drop volume and the number of drops per pixel. Rather than a grouping, the media classes may be separate media types.

Following the training procedure, when an unknown medium of interest is imaged and the input parameters are determined, the media classification may be identified as a function of the distance between the stored references and the information regarding the unknown medium. Thus, the approach may be referred to as cluster-weighted modeling in which joint probability densities are established by mapping the input texture-dependent vectors into a multi-dimensional data distribution. The joint probability densities are used to define probability clusters within the data distribution. The probability clusters are then associated with different media classes.

In order to obtain sufficient information from the imaging of the textural features, the selection and operation of the classification sensor is important. Surface texture of some papers and some transparency films can be most easily imaged using grazing angle illumination, but other media may be more easily identified using other illumination approaches. For example, illumination that enables specular measurements may be preferable in some applications, such as applications in which the various media to be distinguished each exhibit a distinctive specular pattern when surface features are illuminated at a non-grazing angle. The term "grazing angle illumination" will be defined as illumination having an incidence angle of less than 46 degrees relative to the surface of the medium being imaged (i.e., greater than or equal to 45 degrees from the surface normal). Preferably, the incidence angle is in the range of 45 degrees to 75 degrees from the surface normal. Media types have surface textures with features, such as paper fibers, that are characteristic of the different types. That is, each type of print media has a characteristic surface texture that may be used to classify the medium. The surface features that are indicative of the media type tend to have sizes ranging between approximately 5 $\mu$m and approximately 100 $\mu$m. The imaging sensor may have a single pixel or a line of pixels, but preferably employs a two-dimensional array of pixels.

Surface texture can be identified by collecting measured gray-level values obtained from multiple samples over an unprinted area of the medium of interest. Multiple samples can be obtained by scanning a single pixel sensor over the medium surface and recording measurements at different locations, or by using a linear or two-dimensional array. The advantage of the higher pixel count is that multiple samples over a single surface region may be used to obtain the necessary information, so that relative movement between the sensor and the print medium is not required. This allows the media classification to occur while the medium is at rest within an input tray.

In one implementation, the classification sensor has an optical axis along the normal of the plane of the medium and captures an image of the surface illuminated by multiple illumination sources having different wavelengths (e.g., green and blue light emitting diodes (LED)). By using grazing angle illumination, the surface features cast shadows along the media surface. The LEDs may be illuminated sequentially and pixel measurements may be taken under each illumination source. More accurate classification may be achieved by using multiple illumination sources at different incidence angles, such as green and blue at a 45 degree incidence angle to the surface normal and red and infrared at a 75 degree angle to surface normal. Training may be used to establish a look-up table of different media types and/or groups.

A look-up table may also be established for specular characteristics of different media types and/or groups, if specular information is collected as an addition or alternative to collecting the surface information available via grazing angle illumination. Non-grazing illumination for acquiring specular information has the advantage in some applications of requiring fewer samples.

The use of cluster-weighted modeling provides a reliable solution to the problem of media classification. In the application in which the illumination sources are green and blue LEDs and the input parameters are the means ($\mu$) and the standard deviations ($\sigma$), when an unknown medium is imaged, the new set of $\mu$ and $\sigma$ values is determined. In the cluster-weighted modeling, the input vector $x_i$ is defined as:

$$x_i = |\mu_{green}\sigma_{green}\mu_{blue}\sigma_{blue}|$$

and the output vector (which in this case is a scalar y) is the media identification. Each unknown input vector $x_j$ is applied to a predictor, which calculates $p(y,x_j)$ (i.e., the joint density for the dependency of y on $x_j$) from a set of training vector pairs.

An advantage of the invention is that a low-cost reliable method for classifying print media is provided at a scale that permits the method to be implemented entirely within a conventional printer. Alternatively, processing may be shared between the printer and a computer that supports the printer.

The method and system operate by microscopically imaging the surface textures of print media. For example, the surface features that are imaged may be in the range of 5 $\mu$m to 100 $\mu$m.

DETAILED DESCRIPTION

Figure 1:
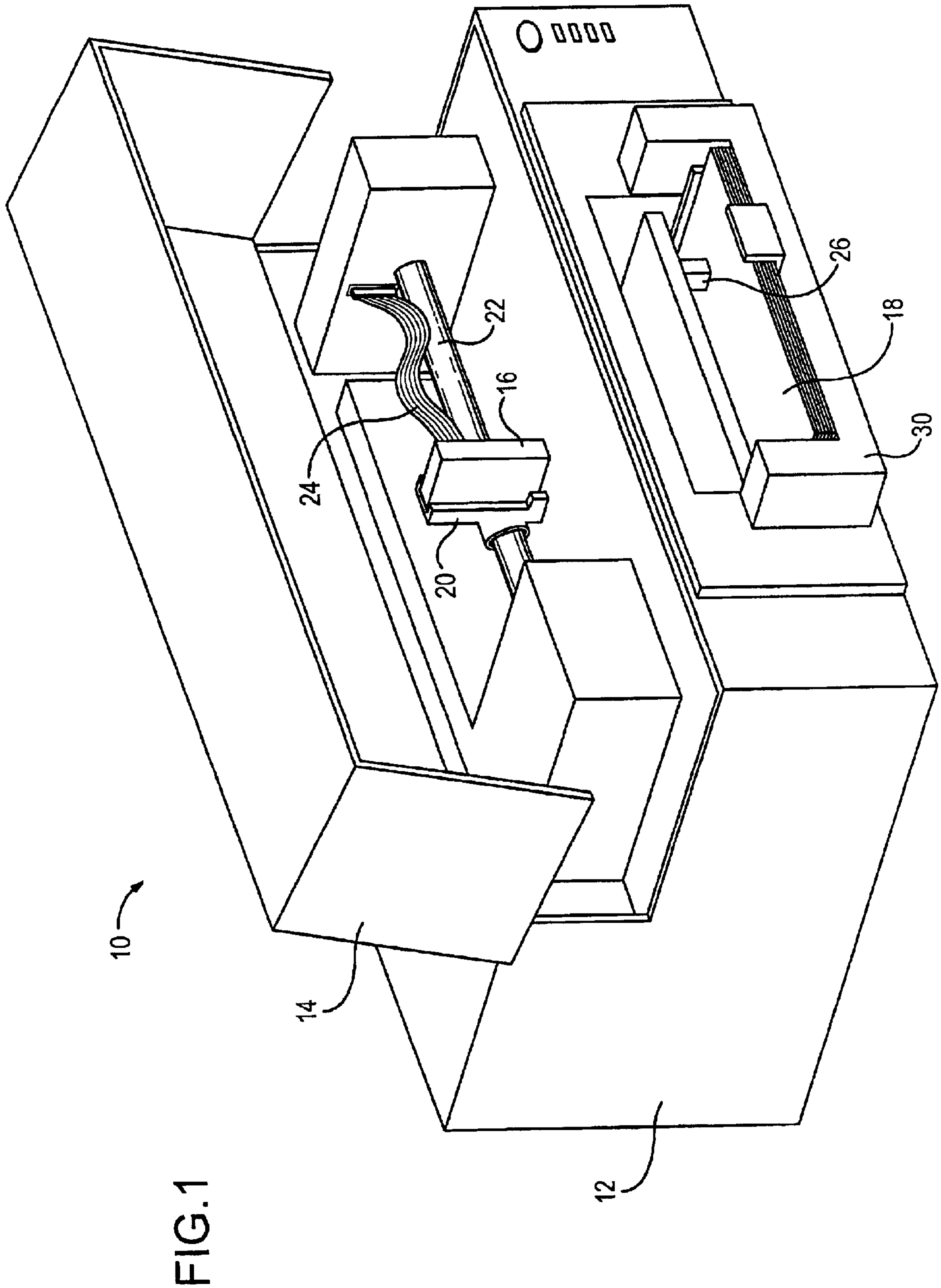
FIG. 1 is a perspective view of a printer having the media classification capability of the present invention, with the capability being implemented at the paper tray level.

The invention utilizes a probabilistic input-output system to associate an unknown medium with one of a number of predetermined different media classes. The association is based upon classifying a surface texture that is characteristic of a particular medium. While the invention may be used in other applications, it is particularly suitable for classifying an unknown medium on which print material, such as ink, is to be applied. In this application, the classification of the medium is used to set print parameters.

A cluster-weighting model (CWM) framework may be used in carrying out the invention. While the CWM algorithm is known, it is not an approach that is well known in the art of media classification. Therefore, a background will be presented below, with a format which follows that of the publication entitled "Cluster-Weighted Modeling: Probabilistic Time Series Prediction, Characterization and Synthesis," Chapter 15, pages 365–385 of *Non-linear Dynamics and Statistics,* by Bernd Schoner and Neil Gershenfeld.

Background of Cluster-weighted Modeling

Cluster-weighted modeling may be used for forming predictions on the basis of probability density estimations of a set of input features and target data. A properly trained CWM defines clusters which are subsets of data space according to domains of influence. The influences of different clusters are weighted by Gaussian basis terms. However, each cluster represents a simple algorithmic model, such as a linear regression function. That is, CWM is a non-linear model, but conventional linear analysis is applicable within localized models.

Firstly, a set of input features (x) is selected and an output target vector (y) is identified. In the media classification application to be described below, the input features are image-related features (e.g., means values and standard deviation values) and y is a scalar identification of the media. During a training process, a set of vector pairs $\{y_n,x_n\}_{n=1}^{N}$ is used. The joint density p(y,x) for the dependency of y on x is determined from the training set of vectors. It is then possible to determine the expected y given x (y|x) and the expected covariance of y given x ($P_{y|x}$).

The joint density can be expanded in clusters ($c_m$). Each of the clusters has an input domain of influence and an output distribution:

$$\begin{aligned} p(x, y) &= \sum_{m=1}^{M} p(y, x, c_m) \\ &= \sum_{m=1}^{M} p(y, x \mid c_m)p(c_m) \\ &= \sum_{m=1}^{M} p(y \mid x, c_m)p(x \mid c_m)p(c_m) \end{aligned} \quad \text{Eq. 1}$$

Non-linear system modeling uses models with linear coefficients $\beta\Theta_m$ and uses non-linear basis functions f(x), $$y(x)=\sum_{m=1}^{M}\beta_m f_m(x) \quad \text{Eq. 2}$$

As an alternative, the models may have the coefficients inside the non-linearities, $$y(x)=\sum_{m=}^{M} f_m(x,\beta_m) \quad \text{Eq. 3}$$

In CWM, the clusters are local models that satisfy Eq. 1, while the global model satisfies Eq. 2. The local parameters are fitted in a singular values decomposition matrix inversion of the local covariance matrix. The remaining cluster parameters that determine the global weighting are acquired using a variant of expectation-maximization (EM) algorithm, which is an iterative search that maximizes the model likelihood, given a data set and given initial conditions. The starting values for the cluster parameters may be selected on the basis of the application, or may be randomly selected. An expectation step (E-step) can then be implemented.

The expectation step includes evaluating the posterior probabilities that relate the clusters to the data points. The posteriors provide the probability (p) that a particular cluster ($c_m$) is generated by particular data (y,x), or the normalized responsibility of a cluster for a data point, so that:

$$\begin{aligned} p(c_m \mid y,x) &= \frac{p(y,x\mid c_m)p(c_m)}{p(y,x)} \\ &= \frac{p(y,x\mid c_m)p(c_m)}{\sum_{l=1}^{M} p(y,x\mid c_l)p(c_l)} \end{aligned} \quad \text{Eq. 4}$$

where the clusters interact through the sum in the denominator to specialize in data that they best explain.

The next step is the maximization step. In this step, the cluster parameters which maximize the likelihood of the data are found. For the cluster weights, this is determined by:

$$\begin{aligned} p(c_m) &= \int p(c_m\mid y,x)p(y,x)\,dy\,dx \\ &\approx \frac{1}{N}\sum_{n=1}^{N} p(c_m\mid y_n,x_n) \end{aligned} \quad \text{Eq. 5}$$

The maximization step follows from the conclusion that an integral over a density can be approximated by an average over variables drawn from the density.

The next computation is to determine the anticipated mean input for each cluster, which is the estimate of the cluster means:

$$\begin{aligned} \mu_m &= \int x p(x\mid c_m)\,dx \\ &= \int x p(y,x\mid c_m)\,dy\,dx \\ &= \int x\frac{p(c_m\mid y,x)}{p(c_m)}p(y,x)\,dy\,dx \\ &\approx \frac{1}{N\,p(c_m)}\sum_{n=1}^{N} x_n p(c_m\mid y_n,x_n) \end{aligned} \quad \text{Eq. 6}$$

-continued $$= \frac{\sum_{n=1}^{N} x_n p(c_m\mid y_n,x_n)}{\sum_{n=1}^{N} p(c_m\mid y_n,x_n)}$$

The introduction of the output vector y into the second line of Eq. 6 allows the estimation to occur on the basis of both the cluster location within the input space and the performance of the input-output system in the output space. That is, the clusters can be defined on the basis of both the locations at which data is to be explained and how well the model explains the data. For a given $p(c_m)$, the cluster-weighted expectation of any function $\theta(x)$ is defined to be:

$$\begin{aligned} \langle\theta(x)\rangle_m &\equiv \int \theta(x)\,p(x\mid c_m)\,dx \\ &\approx \frac{1}{N}\sum_{n=1}^{N}\theta(x_n)\frac{p(c_m\mid y_n,x_n)}{p(c_m)} \\ &= \frac{\sum_{n=1}^{N}\theta(x_n)p(c_m\mid y_n,x_n)}{\sum_{n=1}^{N} p(c_m\mid y_n,x_n)} \end{aligned} \quad \text{Eq. 7}$$

The cluster-weighted expectation may be used to calculate the cluster-weighted covariance matrices:

$$[P_m]_{ij}=\langle(x_i-\mu_i)(x_j-\mu_j)\rangle_m \quad \text{Eq. 8}$$

For updating the local models, the model parameters are found by taking the derivative of the log of the total likelihood function with respect to the parameters:

$$0=\frac{\partial}{\partial\beta}\log\prod_{n=1}^{N} p(y_n,x_n) \quad \text{Eq. 9}$$

For a single output y and a single coefficient $\beta_m$, $$\begin{aligned} 0 &= \sum_{n=1}^{N}\frac{\partial}{\partial\beta_m}\log p(y_n,x_n) \\ &= \sum_{n=1}^{N}\frac{1}{p(y_n,x_n)}p(y_n,x_n,c_m)\frac{y_n-f(x_n\beta_m)}{\sigma_{m,y}^2}\frac{\partial f(x_n,\beta_m)}{\partial\beta_m} \\ &= \frac{1}{Np(c_m)}\sum_{n=1}^{N} p(c_m\mid y_n,x_n)[y_n-f(x_n,\beta_m)]\frac{\partial f(x_n,\beta_m)}{\partial\beta_m} \\ &= \left\langle [y-f(x,\beta_m)]\frac{\partial f(x,\beta_m)}{\partial\beta_m}\right\rangle_m \end{aligned} \quad \text{Eq. 10}$$

Combining Eq. 1 into Eq. 9, the expression to update βm is obtained:

$$\begin{aligned} 0 &= \langle[y-f(x,\beta_m)]f_j(x)\rangle_m \\ &= \underbrace{\langle yf_j(x)\rangle_m}_{a_{j,m}} - \sum_{i=1}^{J}\beta_{m,i}\underbrace{\langle f_j(x)f_i(x)\rangle}_{B_{ji,m}} \\ &\Rightarrow \beta_m = B_m^{-1}\cdot a_m, \end{aligned} \quad \text{Eq. 11}$$

For an entire set of model parameters, Eq. 11 expands to:

$$\beta_m = B_m^{-1} \cdot A_m, \quad \text{Eq. 12}$$

with $$[B_m]_{ij} = \langle f_i(x,\beta_m) \cdot f_j(x,\beta_m) \rangle_m [A_m]_{ij} = \langle y_i \cdot f_j(x,\beta_m) \rangle_m \quad \text{Eq. 13}$$

As final calculations, the output covariance matrices associated with the different models can be estimated by:

$$P_{y,m} = \langle [y - \langle y|x \rangle]^2 \rangle_m = \langle [y - f(x,\beta_m)] \cdot [y - f(x,\beta_m)]^T \rangle_m \quad \text{Eq. 14}$$

To summarize, the CWM process includes a number of steps. The first step is to select initialization conditions and cluster values. This first step may be tailored to the application or may be quasi random in nature. The second step is to evaluate the probability of the data $p(y,x|c_m)$. The posterior probability of the clusters $p(c_m|y,x)$ is then found.

In an update step, a number of calculations are carried out. The updates include recalculating (1) the cluster weights $p(c_m)$, (2) the cluster-weighted expectations for the input means $\mu_m^{new}$, (3) the variance $\sigma_{m,d}^{2new}$ or covariance $P_m^{new}$, (4) the maximum likelihood model parameters $\beta_m^{new}$, and (5) the output variances $\sigma_{m,y}^{2new}$. The process then moves back to the second step of evaluating the probability of the data. The loop continues until the total data likelihood no longer increases.

Practical Application of Media Classification

With reference to FIG. 1, a printer 10 that utilizes the media classification capability of the invention is shown as having a body 12 and a hinged cover 14. The illustrated printer is merely an example of a device in which the invention may be used, since the media classification may be employed in other applications and in other printers, such as liquid and dry electrophotographic printers. The printer 10 includes an ink jet printhead 16, which may be a conventional device. As is well known in the art, the ink jet printhead includes a number of nozzles that are individually triggered to project droplets of ink onto a medium, such as a piece of paper. In FIG. 1, the printer includes sheets 18 of an unspecified medium. The sheets are individually moved to the area immediately below the ink jet printhead during the printing process.

The sheet 18 of print medium is stepped in one direction along a paper path, while the ink jet printhead moves laterally across the sheet in a direction perpendicular to the movement of the sheet. The ink jet printhead is attached to a carriage 20 that moves back and forth along a tray transport rail 22. A flexible cable 24 connects the components of the carriage to a print engine, not shown. The flexible cable includes electrical power lines, clocking lines, control lines and data lines.

An imager 26 is incorporated at the tray level of the printer 10. As will be explained more fully below, the imager 26 allows the printer to determine the type of print medium and allows the parameters of the print engine to be adjusted accordingly in order to obtain the greatest available print quality. Furthermore, identification of the presence of certain types of transparency films or certain papers can be used to prevent damage to the printer. For example, the coatings on some ink jet transparency films may melt on a fuser roller of an electrophotographic printer, causing damage that requires the fuser roller to be replaced.

The imager 26 is employed to obtain image information regarding the media contained within an input tray 30. The imager may include a sensor 28 that is formed of a single pixel or a line of pixels. However, the preferred embodiment utilizes a two-dimensional array of pixels. Depending upon the size of the pixels of the sensor, optics image a specified area of the sheet's surface onto the pixels. Typically, the viewing area of the medium surface is a square having sides in the range of 5 $\mu$m to approximately 100 $\mu$m, with 10 $\mu$m to 40 $\mu$m being preferred. However, in the example of an imager 26 of FIG. 2, the sensor 28 is shown as being rectangular.

Figure 2:
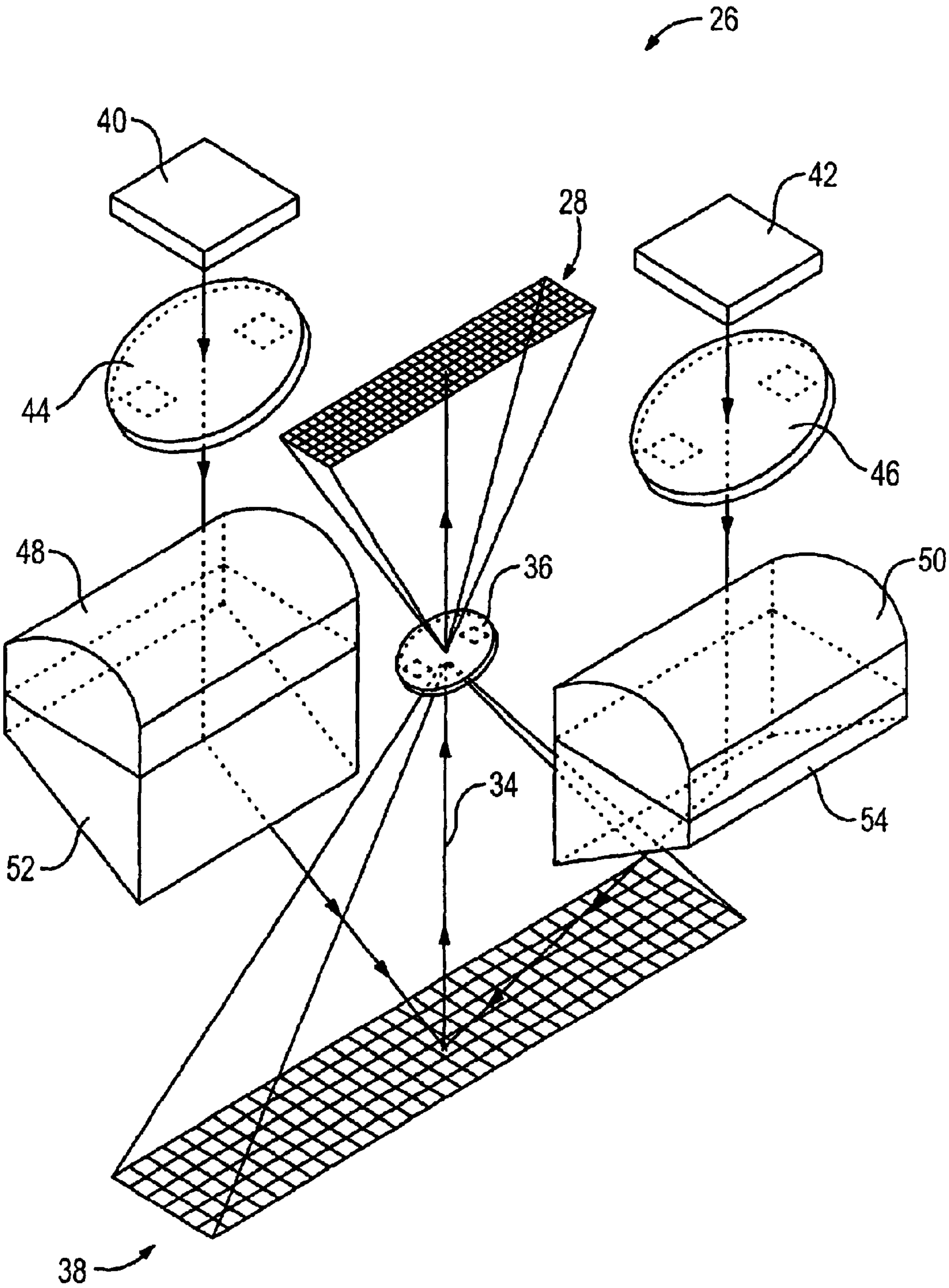
FIG. 2 is a perspective view of an imager of FIG. 1.

Surface texture of the sheet 18 of FIG. 1 can be characterized by a collection of measured gray-level values obtained by multiple samples over an unprinted area of the sheet. Multiple samples may be obtained by scanning a single pixel sensor over the sheet surface and taking measurements at different locations. However, the advantage of using a line sensor or the two-dimensional sensor 28 of FIG. 2 is that multiple samples may be obtained over a region of the sheet's surface without requiring relative motion between the sensor and the medium. This is useful for simplifying the mechanism for classifying the print medium within the input tray 30.

Figure 3:
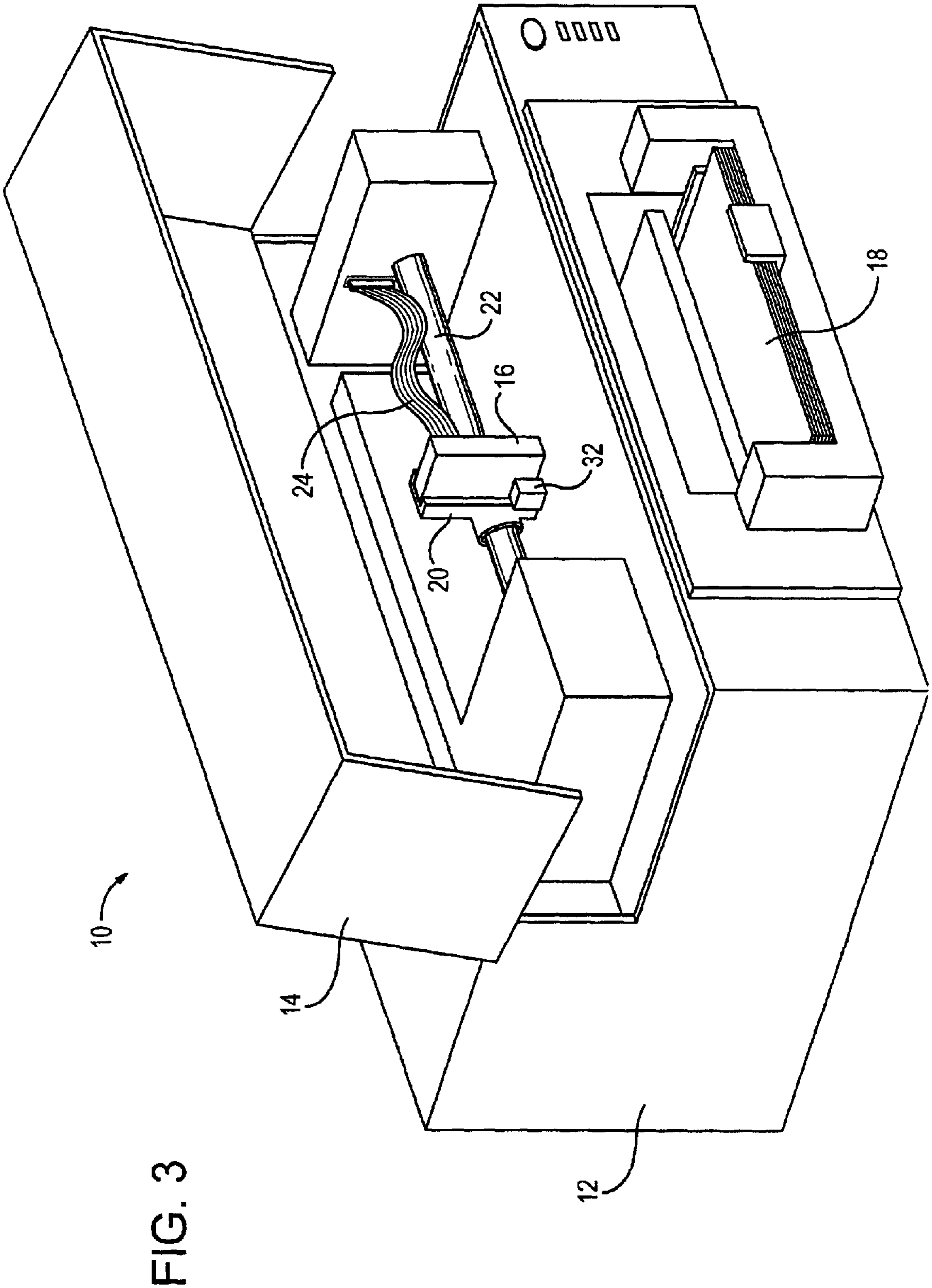
FIG. 3 is a perspective view of a printer having the media classification capability at the printhead carriage level.

As alternatives to FIG. 1, the sensor (either single pixel, line pixels or area pixels) may accumulate multiple samples of the print medium as the sheet is fed from the tray 30 onto the paper path or may be positioned at a location along the paper path. Here, the sensor may be fixed in location or may be mounted to a scanning carriage which moves the imager. FIG. 3 shows an embodiment in which an imager 32 is mounted to the printhead carriage 20. Regardless of the embodiment, the objective is to accumulate multiple samples at different locations, so as to evaluate variations in surface texture. In general, the objective is to improve the sampling statistics by increasing the number of samples.

The image sensor 28 of FIG. 2 preferably has its optical axis 34 along the normal to the plane of the field of view 38 on the print medium. An optical element 36 is positioned along the optical axis to provide magnification, but the magnification level may be one. FIG. 2 shows the field of view 38 along the top surface of the print medium, which may be a sheet of paper. A blocking filter can be added to the imaging optics to prevent light of undesired wavelengths of background illumination from reaching the sensor 28.

While not critical, the embodiment of FIG. 2 includes multiple illumination sources 40 and 42. The two illumination sources may be green and blue LEDs which are illuminated sequentially to allow pixel measurements under each illumination.

Each of the illumination subassemblies includes its light source 40 or 42, a collection lens 44 or 46, a cylindrical lens 48 or 50, and a prism 52 or 54. The function of the cylindrical lens is to transform the usual circular beam cross section from the associated illumination source 40 or 42 into an ellipse of high aspect ratio to better match the aspect ratio of the field of view 38. Therefore, if the sensor 28 has a square configuration, the reconfiguration of the beam by the cylindrical lens is not required. The prisms are used to deviate the beam to the desired angle of incidence onto the print medium. The angle of incidence provides grazing angle illumination (i.e., illumination that is at least 45 degrees to the normal of the surface of the print medium). Incidence angles in the range of 45 degrees to 75 degrees from the surface normal are preferred, but there may be some applications in which non-grazing angle illumination for acquiring specular information is preferable as a substitute or addition to grazing angle illumination. As one example, a green LED may provide light at 45 degrees with respect to the surface normal, while a red LED provides light at a 75 degree angle. A disadvantage of grazing angle illumination is that there are mechanical interference constraints imposed by miniaturization issues and by potential direction-reflection effects arising from localized tilting of the print medium from factors such as area deformation. It is beneficial to provide a depth of field for the illumination that is slightly deeper than the depth of field of the imaging optics. This design should also provide sufficient margin of illumination beyond the perimeter of the field of view 38, so as to accommodate alignment errors between illumination and the subassemblies.

As will be described more fully below, the mean of the gray-level values of pixel data and their standard deviation are derived from images of microscopic surface features under illuminations with different wavelengths and different angles of incidence. The mean value is the average reflectivity of the media and the standard deviation represents a measure of the texture roughness of the media. Using the imager 26 of FIG. 2, the grazing angle illumination will cause shadows from paper fibers and other structural features that are inherent to the print medium that is being imaged. Of course, transparencies do not include paper fibers, but often include heat-induced surface features that are characteristic of such media.

Figure 4:
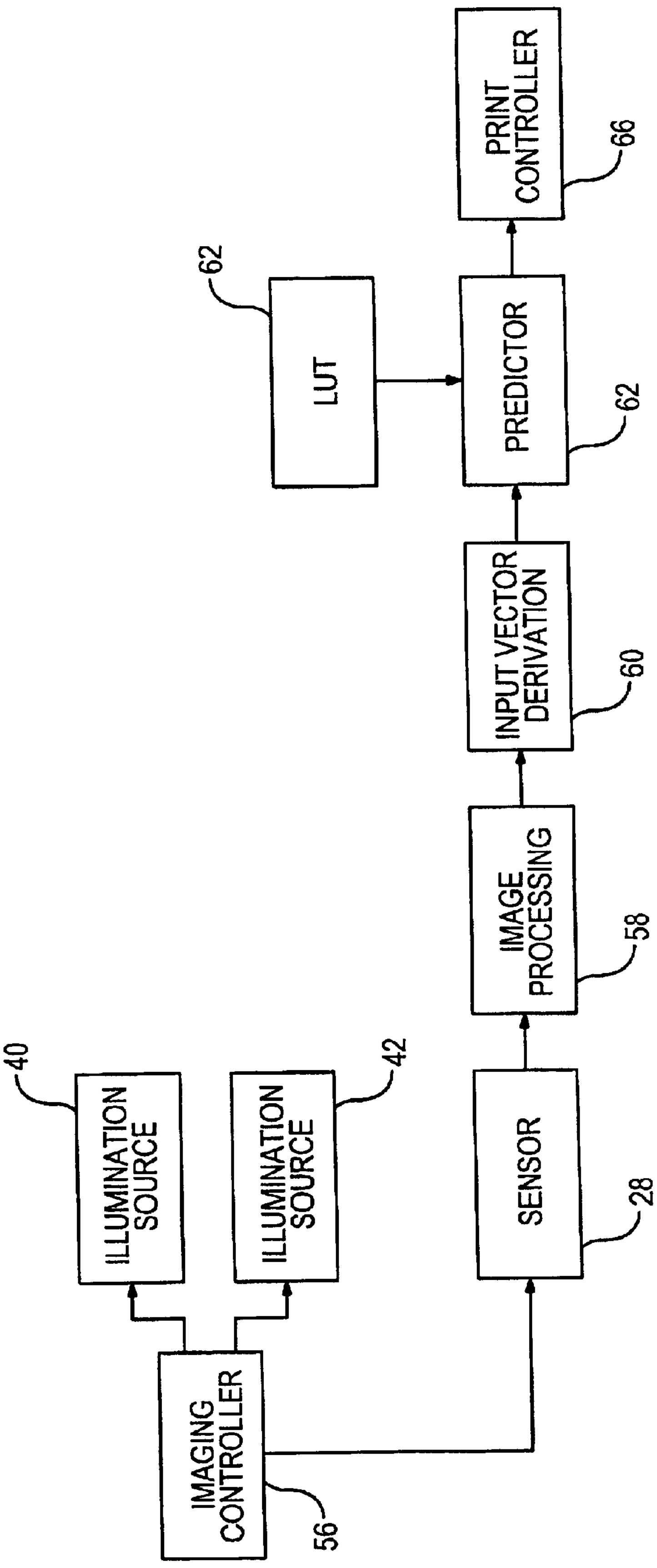
FIG. 4 is a block diagram of components of the printer of FIG. 1.

Referring now to FIG. 4, the system includes an imaging controller 56 which determines operations of the illumination sources 40 and 42 and the sensor 28. The output of the sensor is directed to an image processing component 58. Conventional image processing is implemented within this component 58. Gray-level values are output to an input vector derivation component 60. This component determines the input vectors of the probabilistic input-output system that is the invention. Each input vector ($x_i$) in an embodiment in which samples are taken under green and blue illumination sources may be defined as:

$$x_{i}=\lfloor \mu_{green}\sigma_{green}\mu_{blue}\sigma_{blue}\rfloor$$

The input vectors are received at a predictor 62 that has access to a look-up table 64. During a training process, data samples from various types of media are acquired and the means and standard deviations for each illuminant are computed for the associated angle of incidence. Then, the mean ($\mu$) and the standard deviation ($\sigma$) of the means and standard deviations for each media type are computed and stored in the look-up table 64. Subsequently, when imaging an unknown medium, a new set of $\mu$ and $\sigma$ of the new information is computed. The distances of the new set from the reference sets stored at the look-up table are determined. The media type and/or group is then identified by some function of the distances. In the simplest form, the objective is to find the minimum distance. This simplest solution is somewhat similar to using the same number of clusters as the number of media types in CWM processing. This simplest approach provides satisfactory results if the media data clouds are relatively symmetric and non-singular. However, in many applications of media classification, the $\mu/\sigma$ data clouds are neither symmetric nor non-singular in their domains of influence. In such applications, the CWM framework is preferred. Regardless of the approach, the predictor 62 provides an indication of the media to a print controller 66, which sets print parameters accordingly.

The process will now be described with reference to FIG. 5. In step 68, the system is initialized. The initialization includes calibration of the imager and providing initial configuration of the probabilistic input-output system. In one application, the optics are designed and focused to ensure that the pixel resolution of 8 $\mu$m square is achieved on the medium surface with an optical blur cycle of approximately 20 $\mu$m to 25 $\mu$m. Regarding calibration of the sensor, there are several noise sources associated with any image sensor and data acquisition system. The noise should be reduced, where possible. The major sources of noise are (1) sensor electronic noise (dark current), (2) sensor photon shot noise, (3) pixel-to-pixel variations, and (4) illumination non-uniformity caused by the illumination sources. The first two noise sources are random in nature and can be effectively reduced by averaging. Their impact on the measurements is minor with the choice of adequate illumination levels. Sensor pixel-to-pixel noise is a fixed, high spatial frequency noise, while the illumination non-uniformity is a fixed, low spatial frequency effect. The potential impacts of these two noises are significant. A method of reducing their effects involves taking samples from imaging a white tile illuminated at several intensity levels. The high-frequency and low-frequency effects are separated and a correction look-up table (not shown) having values which depend upon average illumination is used in addressing the individual pixel outputs.

Optionally, the initialization step 68 may include providing a black tile to back up each sheet of print medium that is sampled. This eliminates effects of light that may penetrate multiple sheets. As a result, a more consistent and optimized sampling environment is provided during the training process. It is important that the optical absorption characteristics of the tile used in the training process be identical to those that will be encountered during practical measurement. The black tile could be conveniently replaced with an opening into a non-reflective chamber, which should provide similar results.

In the initialization step 68, clusters should not be initialized arbitrarily, since the algorithm only guarantees to terminate in a local likelihood maximum. The clusters should be placed as close to their final position as predictably possible in order to save training time and to provide a better convergence of data. The method of selecting initial cluster positions may be carried out by first choosing 1/N as the initial cluster probabilities, where N is the number of clusters. The next substep is to randomly select as many points from the training set as there are clusters and to initialize the cluster input mechanism and the cluster output mechanism with these points. The remaining output coefficients should be set to zero. The sizes of the data sets and the space dimensions can then be used as the initial cluster variances. Regarding normalization, it may be required to normalize the training set to zero main and unit variance, since arbitrary data values may cause probabilities to become too small.

There is no rule as to how many clusters is optimal to a specific application. The number of clusters should be larger than the number of distinguishable outputs, which in this case is the number of media classes. However, more clusters do not mean better discrimination. When there are too many small clusters, establishing membership may be difficult, especially when a region is populated with many small clusters belonging to different media classes. The same is true for the number of training iterations between expectation and maximization steps (see above) when the number of clusters is constant. Therefore, an iterative search of increasing numbers of clusters and number of training iterations may be performed and determined empirically. For example, with a sample of seven similar media, it was determined that twenty-four clusters and twenty-three iterations were optimal, and this provided the highest correct classification weight. A simplification of the twenty-four clusters is shown in the CWM data space of FIG. 6.

Figure 5:
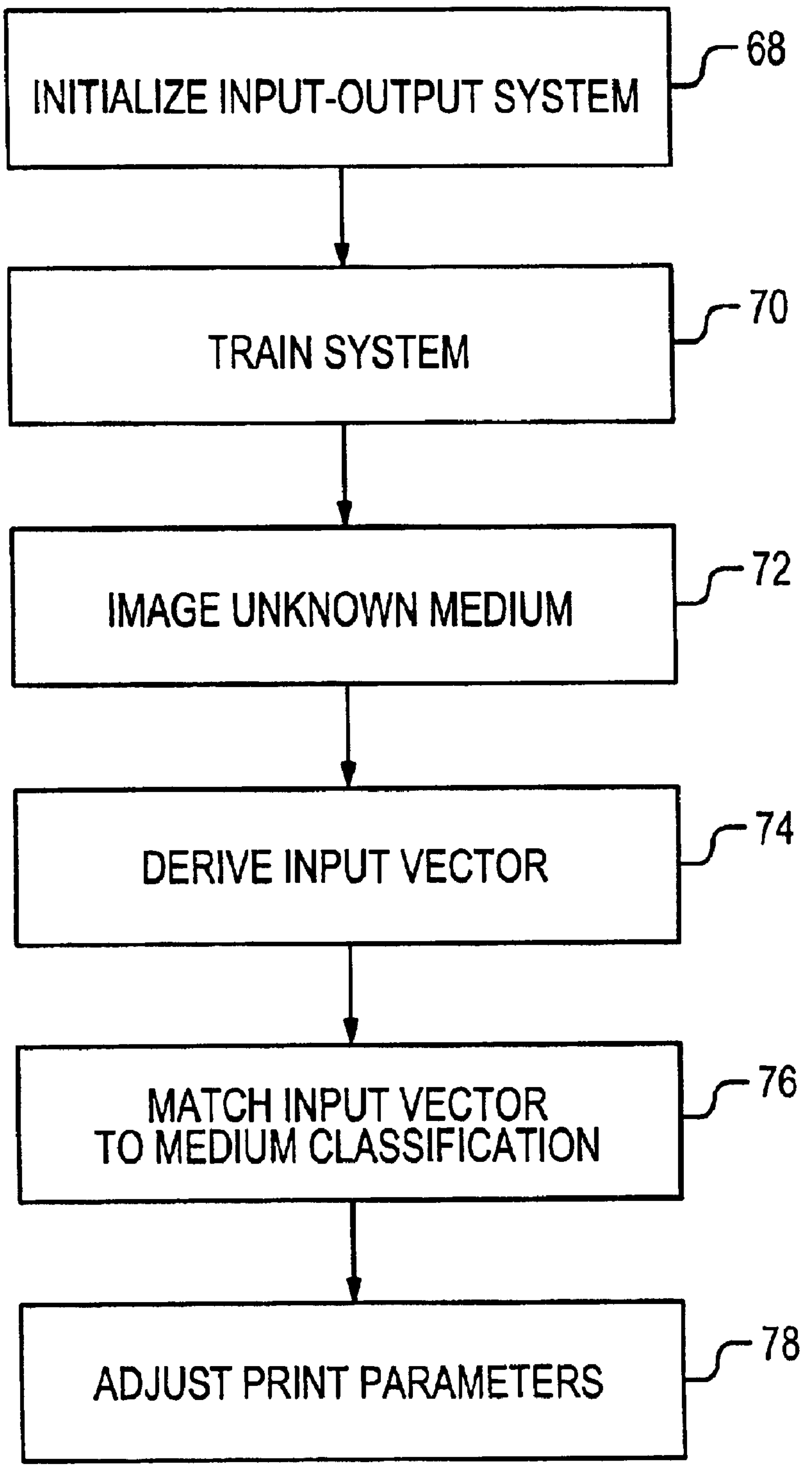
FIG. 5 is a process flow of steps for implementing the invention.
Figure 6:
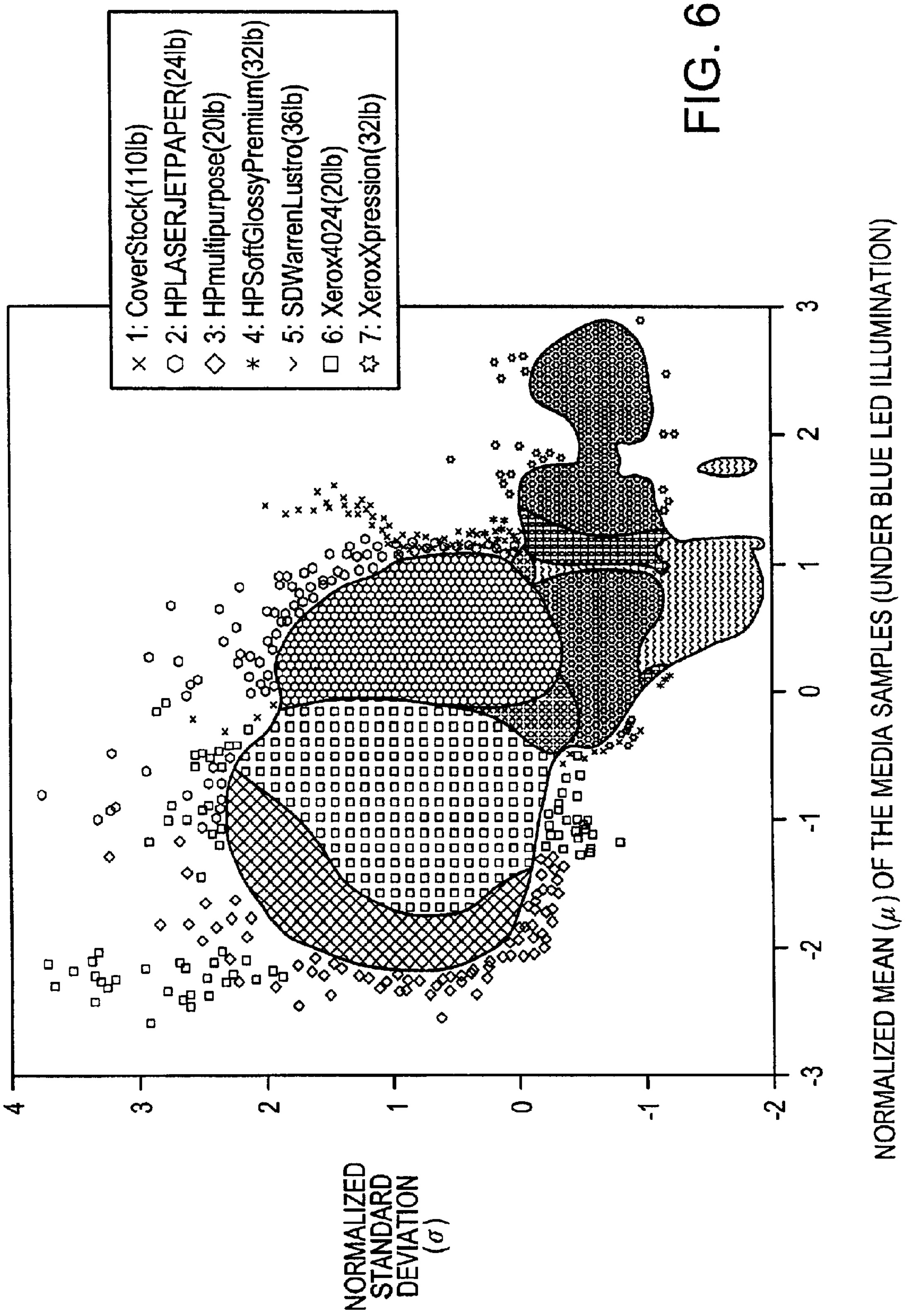
FIG. 6 is an example of data space showing clusters of data.

At step 70 of FIG. 5, the probabilistic input-output system is trained to provide a model such as that shown in FIG. 6. Within the training process, a set of vector pairs $\{y_i,x_i\}_{i=1}^{N}$ is used to provide the CWM input-output model, with the local models (clusters) satisfying $y=\beta_m \cdot x$. Subsequently, when an unknown input vector $x_j$ is applied to the predictor 62 of FIG. 4, the predictor will calculate $p(y, x_i)$ according to the trained CWM model to provide the probabilities of that input vector with respect to all of the media classes. As previously noted, the media classifications may be related to one or both of a type of media or a group of media types. The probability that an unknown medium belongs to a particular media group can be determined by adding all of the probabilities for the different media types that belong to that media group.

The training process at step 70 is both time consuming and computationally intensive, especially in the process of gathering all different media samples. It may take several thousand input vectors for each media type to provide a reliable estimate of the media distribution (i.e., the "media cloud"). It is computationally intensive because of the required statistical calculations and matrix manipulations. Fortunately, the process can be implemented off-line and only once for all media types/groups to be used for a particular printer. Thus, the training process is updated only when a new media type or a new media group is introduced or when changes are made to the imager.

It is practical to train a printer to each new media classification if bidirectional communications exist between a printer and its host computer and the appropriate software is installed on the host. In this case, the training for additional media classifications could occur during a time when the printer is idle. The media classification sensor would provide the raw pixel data to the host computer for processing and association with the new media type sample.

It is possible to implement the media classification solution entirely within a printer. In this case, the printer resources must include some image processing capability to optimize the raster image data for rendering a particular print algorithm. However, the printer and its host computer may cooperate in the processing.

The size of the cluster parameters is determined by the dimensions of input and output. Therefore, the storage requirements of the look-up table 64 of FIG. 4 are determined by the number of clusters and the dimensions of the input-output vector pairs. The look-up table may be relatively small, on the order of a few kilobytes. Therefore, the entire CWM implementation in a printer having a media sensor should have a footprint of several kilobytes, which is extremely small by current memory standards.

Following the training step 70 of FIG. 5, the system is fully enabled. At step 72, an unknown medium, such as a particular type of paper, is imaged using the sensor 28 of FIGS. 2 and 4. The input vector $x_j$ is derived at step 74 from the image data. The resulting input vector is matched to data stored within the look-up table 64 in order to classify the media type, as indicated at step 76. Based upon the identified media type, print parameters, such as droplet size, can be adjusted at step 78 by the print controller 66.

The invention has been described and illustrated as being a combination of (1) microscopic imaging of characterizing textural features, such as paper fibers, (2) grazing angle illumination, (3) using CWM techniques for matching image-related measurements to a media class characterized by the measurements, and (4) adjusting print parameters on the basis of the match. However, modifications have been anticipated. For example, the process may be used in applications in which print parameters, such as droplet size, are not a consideration. Moreover, as previously noted, non-grazing angle illumination may be used in addition to or as a substitute for grazing angle illumination. Thus, the invention is not limited to its preferred embodiment.

What is claimed is:

1. A method of classifying media comprising:

generating a probabilistic input-output system having at least two input parameters and having an output which has a joint dependency on said input parameters, said input parameters being associated with image-related measurements acquired from imaging textural features which are characteristic of different classes of media, said output being an identification of a media class;

imaging a medium of interest to acquire image information regarding textural features of said medium of interest, said textural features being related to structure of said medium of interest;

determining said image-related measurements from said image information; and employing said probabilistic input-output system to associate said medium of interest with a selected said media class, including using said image-related measurements determined from said image information as said input parameters; wherein generating said probabilistic input-output system includes:

imaging a plurality of samples of each of said media classes;

calculating said image-related measurements for each of said samples that are imaged;

on a basis of said input parameters that are associated with said image-related measurements, mapping each said sample in a multi-dimensional data distribution to form a cluster-weighted model (CWM) in which joint probability densities established by said mapping are used to define probability clusters within said data distribution; and associating said probability clusters with said media classes.

2. The method of claim 1 wherein generating said probabilistic input-output system includes relating texture-dependent vectors (x) to media-identification outputs (y), said input parameters being parameters of said texture-dependent vectors.

3. The method of claim 2 wherein generating said probabilisitic input-output system includes using mean values ($\mu$) of the reflectivities of said medium classes and standard deviations ($\sigma$) of said reflectivities as said input parameters.

4. The method of claim 1 further comprising setting print parameters for applying print material on said medium of interest, including basing settings of said print parameters on said output of said probabilistic input-output system.

5. The method of claim 1 wherein said associating said probability clusters includes forming a look-up table which correlates said probability clusters with said media classes, said media classes including at least one type of paper.

6. The method of claim 1 wherein said imaging includes projecting light onto said medium of interest at an angle of less than 45 degrees relative to an imaged surface of said medium of interest.

7. The method of claim 6 wherein said imaging further includes detecting surface features having dimensions of 100 $\mu$m or less.

8. The method of claim 1 wherein said imaging includes projecting light onto said medium of interest at an angle greater than 45 degrees relative to an imaged surface of said medium of interest said image-related measurements being specular measurements.

9. A method of performing media classification with respect to a plurality of different media classes, the method comprising:

acquiring statistics about surface textural features that are inherent to the different media classes; and generating a probabilistic input-output system having a least two input parameters and having an output which has a joint probability densisty dependency on said input parameters, said input parameter being associated with said statistics, said output being an identification of a media class, including utilizing cluster-weighted modeling in implementing said probabilistic input-output system so as to define clusters which are subsets of data space according to domains of influence.

10. A method of classifying a medium of interest with respect to a plurality of different media classes, the medium having surface textural features that are inherent to the medium, the method comprising:

acquiring image information about the surface textural features inherent to said medium;

generating statistics about the surface textural features from the acquired information; and using a cluster-weighted input-output model to discriminate the medium against the media classes on a basis matching said statistics to clusters which are subsets of data space according to domains of influence, including using said statistics as input parameters to the model said discrimination of said medium having a joint probability density dependency on said statistics.

11. A system for performing the method of claim 10.

12. A printer for performing the method of claim 10.

* * * * *